(12) United States Patent
Crowley et al.

(10) Patent No.: US 6,309,916 B1
(45) Date of Patent: Oct. 30, 2001

(54) METHOD OF MOLDING PLASTIC SEMICONDUCTOR PACKAGES

(75) Inventors: Sean T. Crowley, Phoenix; Gerald L. Cheney, Chandler; David S. Razu, Gilbert, all of AZ (US)

(73) Assignee: Amkor Technology, Inc, Chandler, AZ (US)

( * ) Notice: Subject to any disclaimer, the term of this patent is extended or adjusted under 35 U.S.C. 154(b) by 0 days.

(21) Appl. No.: 09/441,115

(22) Filed: Nov. 17, 1999

(51) Int. Cl.[7] .................. H01L 21/44; H01L 21/48; H01L 21/50; H01L 23/12; H01L 23/053; H01L 23/28; A23G 1/22; A23G 3/12; A23G 3/16; A23P 1/00; B21C 3/00; B23B 19/00; B23B 23/00; B23B 3/10; A01J 21/00; A01J 25/12; A21C 11/00; A21C 3/00; B28B 11/00; B28B 21/00

(52) U.S. Cl. ................ 438/127; 257/701; 257/787; 425/116; 425/117; 425/394

(58) Field of Search ................ 438/127; 425/116, 425/117, 394; 257/701, 787

(56) References Cited

U.S. PATENT DOCUMENTS

| | | | |
|---|---|---|---|
| 4,092,226 | 5/1978 | Laing et al. | 204/51 |
| 4,615,857 | * 10/1986 | Baird | 264/272.17 |
| 4,717,456 | 1/1988 | Chessin et al. | 204/34 |
| 4,872,825 | * 10/1989 | Ross | 425/117 |
| 5,766,649 | * 6/1998 | Azuma | 425/116 |
| 5,829,240 | * 11/1998 | Benson et al. | 57/125 |

FOREIGN PATENT DOCUMENTS

| | | | |
|---|---|---|---|
| 09199522A | 7/1997 | (JP) | H01L/21/56 |
| 10286845A | 10/1998 | (JP) | B29C/45/37 |

OTHER PUBLICATIONS

Chessin et al., "Hard Chromium Plating," *Metals Handbook*, Ninth Ed., vol. 5, pp. 170–187.
Armoloy Chromium Plating by Armoloy Company of Philadelphia, pp. 1–2, Website, http://www.armoloycompany.com/.
"Armoloy® Nodular Thin Dense Chromium"and "Special Armoloy© Properties", pp. 1–2, Website http:/www.armoloycompany.com/properties.html.
"Armoloy® Nodular Thin Dense Chromium"—Typical Industries, pp. 1–2, Website http://www.armoloycompany.com/applications.html.
Armoloy Company of Philadelphia—Comparison Chart, Characteristics, Performance, pp. 1, Website, http://www.armoloycompany.com/compare.html.
Armoloy Company of Philadelphia—Working with Armoloy® of Philadelphia is as easy as . . . 1–2–3, pp. 1–2, Website, http://www.armoloycompany.com/process.html.

* cited by examiner

*Primary Examiner*—Charles Bowers
*Assistant Examiner*—Nema Berezny
(74) *Attorney, Agent, or Firm*—Skjerven Morrill MacPherson LLP; Don C. Lawrence

(57) ABSTRACT

In the manufacture of semiconductor packages having molded plastic bodies, the plating of all of the surfaces of the molding tool that comes into contact with the molten resin during molding with a nodular thin dense chromium ("NTDC") coating prevents the surfaces from adhering to the package body and ensures good package release, without formation of cracks or craters in the package body. This, in turn, permits the amount of both release agents and adhesion promoters used in the molding compound to be substantially reduced, or eliminated altogether, thereby resulting in a package body having improved strength and adhesion with the components of the package, and hence, an improved resistance of the package body to the propagation of cracks and its subsequent penetration by moisture.

13 Claims, 4 Drawing Sheets

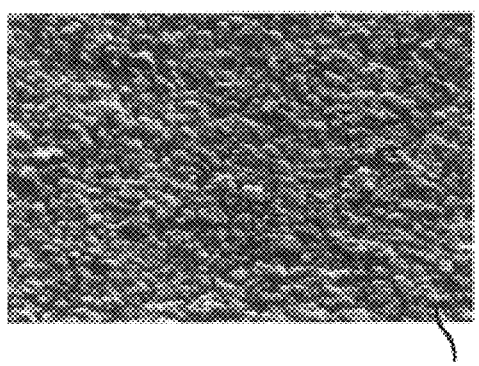
FIG. 7 70
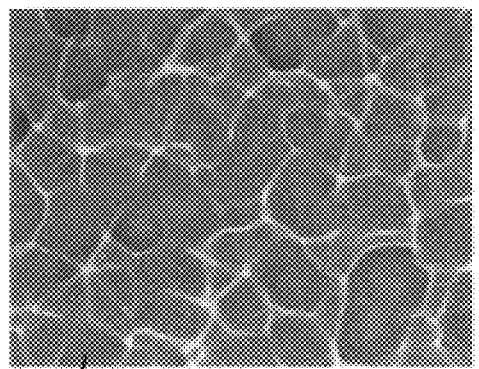
72 FIG. 8
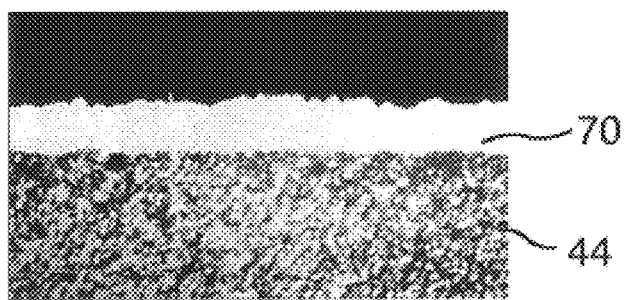
FIG. 9

METHOD OF MOLDING PLASTIC SEMICONDUCTOR PACKAGES

BACKGROUND OF THE INVENTION

1. Field of the Invention

This invention pertains to semiconductor packaging in general, and in particular, to an improved method for molding the plastic bodies of semiconductor packages.

2. Description of the Related Art

Integrated circuits ("ICs") are formed on a single die, or "chip," cut from a semiconductor wafer containing a large number of identical dies. The dies are relatively small and fragile, are susceptible to harmful environmental elements, particularly moisture, and generate a relatively large amount of heat in a relatively small volume during operation. Accordingly, ICs must be packaged in affordable, yet robust, packages that protect them from the environment, permit them to be reliably mounted to and interconnected with, for example, a printed circuit board ("PCB") populated with associated electronic components, and to dissipate effectively the heat they generate during operation.

In both leadframe and grid array types of packages, a leadframe or substrate assembly having a plurality of leads or traces and a semiconductor die attached to it and electrically connected to the leads is placed in the cavity of clam-shell molding tool, and a molten plastic, typically, an epoxy resin, is transferred into the cavity of the mold to form a hard, strong body over the die, interconnects, and leads or traces, to seal and protect those components from the environment.

A problem with the conventional package transfer molding technique relates to the tendency of the molding compound to adhere to the surfaces of the molding tool, including the cavity, chase and ejector pins of the mold, that come into contact with the plastic molding compound during the molding process. If the molding compound adheres appreciably to these surfaces of the mold, the package will not release completely from the mold, resulting in the formation of cracks or craters in the package body, defective packages, and/or the subsequent penetration of the package by damaging moisture.

Another, countervailing, package molding problem relates to an incomplete or defective adhesion of the plastic package body to the package components, i.e., the leadframe or substrate, wire bonds, the die, and other components. This can result in a delamination of the plastic body from the components and the subsequent propagation of cracks and penetration of the package by moisture.

In particular, where delamination occurs at a boundary of the package body, a microscopic crack is created for the penetration of the package by moisture. This penetration can wreak a two-fold assault on the package: First, the moisture can corrode any metallizations present in its path, resulting in subsequent current leakage through the corrosive path; and second, the moisture can expand and contract with temperature cycling of the package, resulting in further propagation of the cracks into the package, and hence, further penetration of the package by moisture.

To address the mold-sticking problem, a "mold release agent" is usually incorporated into the molding compound. However, this can create an additional problem, in that, while the mold release agent prevents the molding compound from adhering to the molding tool, it also reduces the adhesion of the molding compound to the components of the package. To offset this reduction, an "adhesion promoter," or "coupling agent," is also typically added to the molding compound to enhance adhesion of the compound to the components of the package.

However, this latter addition can also create some problems, in that coupling agents can increase the melt viscosity of the molding compound, thereby reducing the surface wetting of the lead frame surface and other components of the package by the molding compound. This increase in viscosity is caused by the premature cross-linking of the base resin and the hardener during the transfer of the molding compound into the mold cavity due to the relative overabundance of the coupling agent. This reduction in surface wetting can result in imperfect adhesion between the molding compound and the components of the semiconductor package, and hence, voids, cracks, and potential delamination.

It is therefore desirable to provide an improved method of molding a plastic body onto a semiconductor package that reduces or prevents adhesion between the body and the molding tool, thereby preventing the molding of defective package bodies, and permitting the amount of both release agents and adhesion promoters used in the molding compound to be substantially reduced, or eliminated altogether. This would result in a stronger semiconductor package body having improved adhesion with the components of the package, and hence, an improved resistance to the propagation of cracks and subsequent penetration of the package by moisture.

BRIEF SUMMARY OF THE INVENTION

This invention provides an improved method for transfer molding a plastic body on a semiconductor package that reduces or prevents adhesion between the body and the molding tool, permitting the amount of both release agents and adhesion promoters used in the molding compound to be substantially reduced, or eliminated altogether, and thereby resulting in a semiconductor package body having improved strength and adhesion with the components of the package, and hence, an improved resistance to the propagation of cracks and subsequent penetration of the package by moisture.

The method of the invention comprises forming a coating of nodular thin dense chromium ("NTDC") on all of the surfaces of the mold "chase" that come into contact with the plastic molding compound during the molding process, including the resin pot, the transfer ram or piston, the runner, the gate, the vent, the ejector pins, and the cavity of the mold. This unique finish prevents the plastic of the package body from adhering to these surfaces of the mold during the molding process and ensures good package release from the mold, without formation of cracks or craters in the package body. This, in turn, permits the amount of both the release agents and the adhesion promoters used in the molding compound to be substantially reduced, or eliminated altogether, resulting in a semiconductor package body having improved strength and adhesion with the components of the package, and hence, an improved resistance of the package to the propagation of cracks, delamination, and subsequent penetration by moisture.

The method also includes the conventional steps of attaching a semiconductor die to the surface of an array of conductive leads, which may be in the form of a leadframe or an insulative substrate. The die is electrically connected to the inner portions the leads, and the assembly is placed in the cavity of a molding tool having surfaces plated as described above. A molten epoxy resin molding compound is transferred into the cavity to mold a protective body around the die, the inner portions of the leads, and the electrical connections between them, while outer portions of the leads are left exposed exteriorly of the body for making electrical connections with components external to the package.

A better understanding of the present invention may be had from a consideration of the detailed description below, particularly if such consideration is made in conjunction with the drawings.

BRIEF DESCRIPTION OF THE SEVERAL VIEWS OF THE DRAWINGS

FIG. 7 is a microscopic view of a surface plated with nodular thin dense chromium;

FIG. 8 is a microscopic view of a surface plated with a conventional hard chromium plating; and, FIG. 9 is a microscopic cross-sectional view of a surface plated with nodular thin dense chromium.

DETAILED DESCRIPTION OF THE EXEMPLARY EMBODIMENTS

Figure 1:
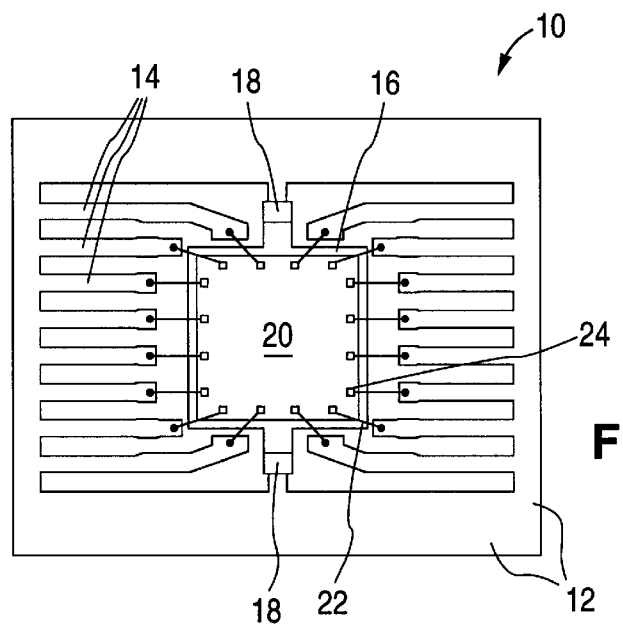
FIG. 1 is a plan view of a leadframe for a typical leadframe type of semiconductor package showing a semiconductor die bonded to its upper surface and electrically connected to the inner ends of its leads.
Figure 2:
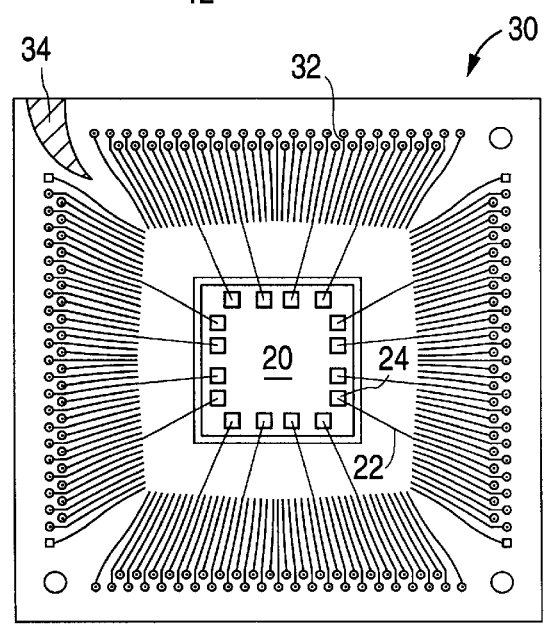
FIG. 2 is a plan view of an insulative substrate for a typical grid array semicondiutor package showing a semiconductor die bonded to its upper surface and electrically connected to the inner ends of its conductive traces.
Figure 4:
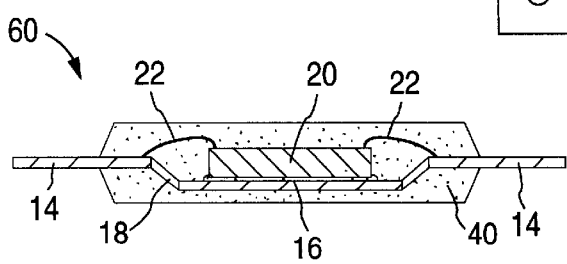
FIG. 4 is a cross-sectional side elevation view of the leadframe assembly of FIG. 1 after the protective plastic epoxy resin body has been molded onto it.
Figure 5:
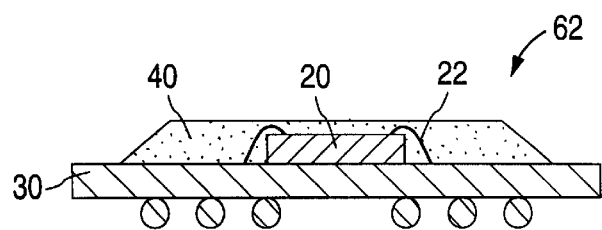
FIG. 5 is a cross-sectional side elevation view of the substrate assembly of FIG. 2 after the protective plastic epoxy resin body has been molded onto it.
Figure 3:
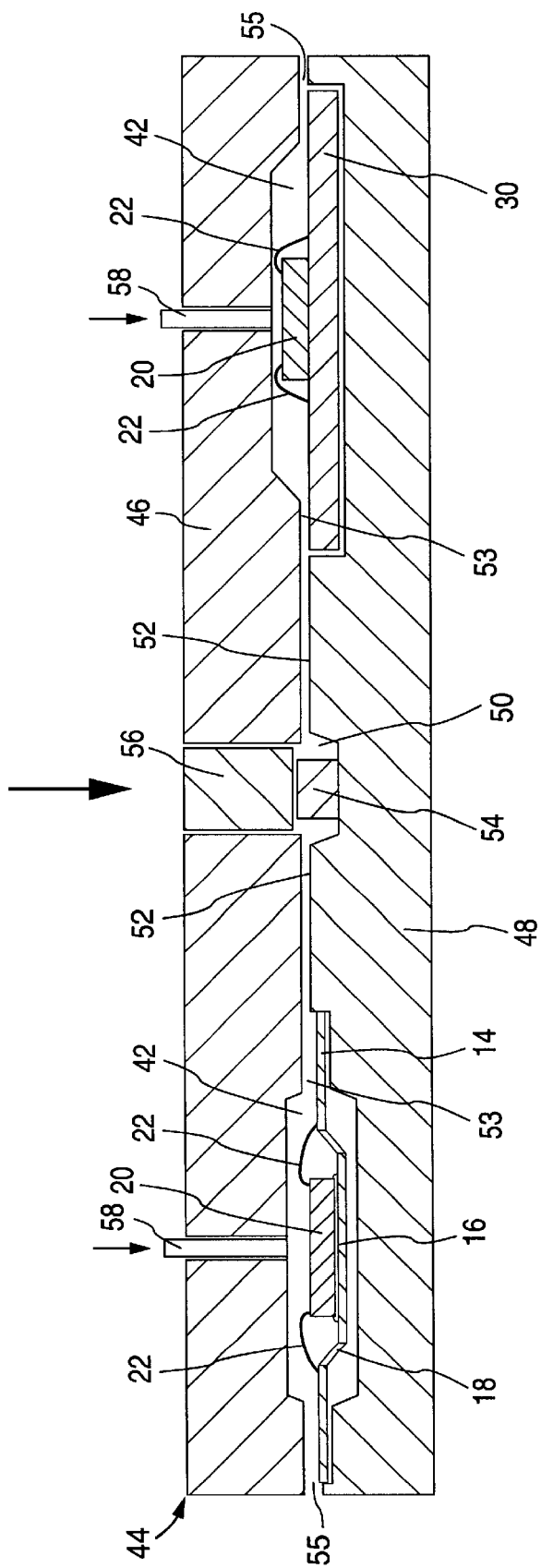
FIG. 3 is a cross-sectional side elevation view of the leadframe and substrate assemblies of FIGS. 1 and 2 shown respectively placed in the cavities of a molding tool for transfer molding a protective plastic epoxy resin body over the respective assemblies in accordance with an embodiment of this invention.

FIGS. 1, 3 and 4 show the sequential stages in the manufacture of a typical leadframe type of semiconductor package, while FIGS. 2, 3 and 5 show similar stages in the manufacture of a typical grid array package.

In FIG. 1, a top plan view of a leadframe 10 is shown. The metal lead-frame 10 comprises a rectangular frame 12 having a central region and a matrix of leads 14 extending from it inwardly toward the central region. A die mounting pad 16 is supported in the central region of the frame by two or more tie-bars 18. A semiconductor die 20 is mounted by an adhesive to the upper surface of the die mounting pad 16 and is electrically connected to selected ones of the inner portions of the leads 14 by a plurality of fine, conductive bonding wires 22 that are bonded at their opposite ends to pads 24 on the die and selected ones of the leads 14, respectively.

A top plan view of a substrate 30 used in the manufacture of a typical grid array package is shown in FIG. 2. The substrate 30 comprises a rectangular sheet of insulative base material, e.g., a polyimide tape or a matrix of epoxy and fiberglass, having a plurality of conductive traces 32 formed on its upper surface and fanning out from a central region thereof. A semiconductor die 20 is mounted by an adhesive to the upper surface of the central region of the substrate and is electrically connected to selected ones of the inner portions of the traces 32 by, e.g., a plurality of conductive bonding wires 22 that are bonded at their opposite ends to pads 24 on the die 20 and selected ones of the traces 32, respectively. The traces 32, in turn, connect through the substrate 30 to lands (not illustrated) on the lower surface thereof by plated-through via holes. The substrate 30 may include a plated-on structure 34 (shown cross-hatched in FIGS. 2 and 6) of, e.g., palladium, that functions as a mold gate runner in the manner described below.

After the die 20 is attached to the leadframe 10 (FIG. 1) or the substrate 30 (FIG. 2) and electrically connected to the leads 14 or traces 32 thereon, respectively, it is necessary to protect the relatively fragile components of the respective assemblies, viz., the die 20, the bonding wires 22, and the metal leads 14 or traces 32, from harmful environmental agents, such as shock, vibration, and particularly, moisture. This is achieved by encapsulating the foregoing structures within a strong, monolithic body 40 of a high-density plastic, e.g., an epoxy resin.

The molding of the package body 40 is illustrated schematically in FIG. 3. The assembly of the leadframe 10 or substrate 30, with the die 20 attached and interconnected to it, is placed in the cavity 42 of a molding tool 44. The molding tool typically comprises an upper plate 46 and a lower plate 48, each having a surface in mating opposition with that of the other, and into which the cavity 42 is formed. The cavity 42 is connected to a heated reservoir, or "pot" 50 by a conduit, or "runner," 52, which enters into the cavity 42 through a "gate" 53. Importantly, the cavity 42 has internal surfaces that contact the molding compound 54 during the molding process and serve to shape and form the exterior outline of the package body 40.

During the molding process, an epoxy molding compound 54 in a solid, pelletized form is dispensed into the heated pot 50, where it is quickly melted to a molten state. A close-fitting piston or "ram" 56 is then brought down forcefully into the pot 50 in the direction of the large arrow shown in FIG. 3, and the molten plastic compound 54 is thereby forced out of the pot, through the runner 52 and the gate 53, and into the cavity 42 of the mold 44 to form the body 42 over the die 20, the interconnects 22, and the leads 14 or traces 32 of the respective assemblies.

Air vents 55 extending through the walls of the mold 44 permit the air in the cavity 42 to be expelled by the inrushing molding compound 54. When the molding compound is cured solid on the leadframe or substrate assembly, the upper and lower plates 46 and 48 of the mold are separated from each other, and one or more ejector pins 58 in the mold 44 are actuated in the direction of the small arrows shown in FIG. 3 to eject the newly molded leadframe package 60 or grid array package 62, shown in cross-sectional elevation views in FIGS. 4 and 5, respectively, from the cavity 42 of the mold.

It may be noted in FIG. 3 that, in the case of a grid array package 62, the plastic body 40 is formed entirely on the upper surface of the substrate 30, so that the substrate forms the lower surface of the package body. In this case, it may be seen that the upper surface of the substrate also serves to define the lower surface of the runner 52 and gate 53 leading into the cavity 42, which is conventionally let into a corner of the rectangular cavity so that the molten resin 54 flows across the cavity toward the diagonally opposite corner and the vent 55 located thereat. Ordinarily, the resin 54 would adhere to this portion of the upper surface of the substrate 30 to leave an undesirable plastic sprue at the location of the runner 52 after molding. Accordingly, in the case of a grid array package 62, it is conventional to plate the upper surface of the substrate 30 in the region of the runner 52 and gate 53 with a noble metal, e.g., palladium, to form a mold runner gate 34 (see FIG. 2) that has a low adhesion with the molding compound, and thus permits the plastic sprue formed in the runner during molding to be easily removed from the package after molding.

Figure 6:
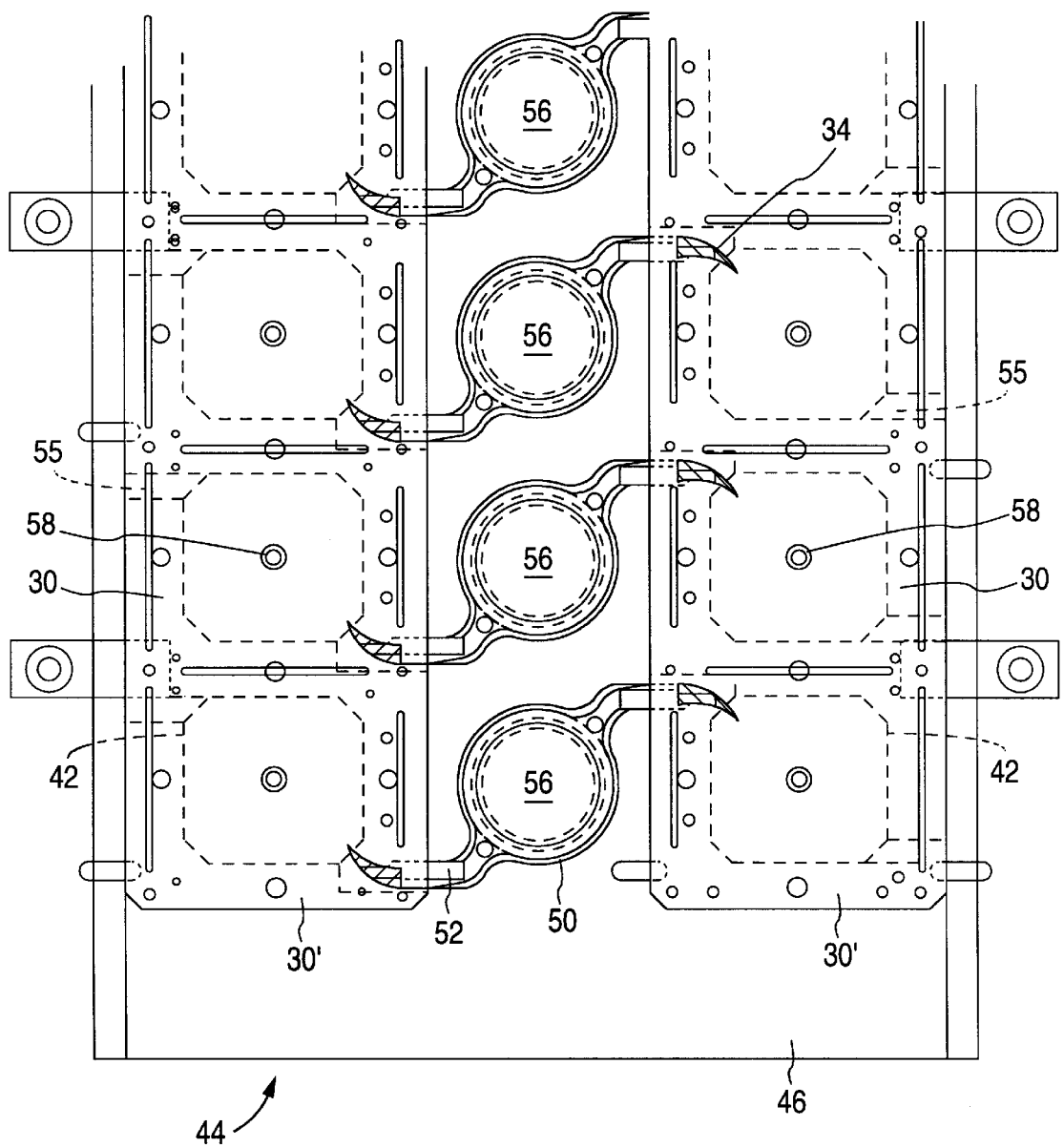
FIG. 6 is a partial plan view of a molding tool used to mold simultaneously a plurality of protective plastic epoxy resin bodies onto a plurality of surface mount grid array semiconductor packages of the type illustrated in FIG. 5.

FIG. 6 is a partial top plan view of a production transfer molding apparatus 64 used to mold plastic package bodies 40 onto a plurality of grid array packages 62 simultaneously. It may be noted that, in such mass production molding, a plurality of substrates 30 are joined together end-to-end to form a strip 30' for simultaneous processing of a plurality of packages. The plurality of generally rectangular mold cavities 42 in the lower surface of the upper plate 46 of the mold 44, each overlying an individual substrate 30, are indicated by dashed lines. It should be understood that, while FIG. 6 illustrates the simultaneous molding of plastic bodies 40 onto a plurality of grid array packages 62, a substantially similar apparatus and process are used to mold plastic bodies onto a plurality leadframe packages 60 of the type illustrated in FIG. 4.

The formulation of molding compounds 54 for semiconductor packages is a series of compromises calculated to produce desired properties, e.g., good adhesion between the compound and the components of the package 60 or 62, while minimizing undesirable effects, such as mold sticking and interfacial defects caused by unbalanced and/or incomplete polymer cross-linking. Accordingly, two seemingly antithetical components commonly used in the formulation of molding compounds are mold release agents and adhesion promoters.

As a class, epoxies are inherently excellent adhesives and will bond easily with most materials, including the surfaces of the "chase" of the molding apparatus that come into contact with the molding compound 54 during the molding process, including the pot 50, piston 56, runner 52, gate 53, cavity 42, vent 55, and ejector pins 58. This adhesion is undesirable, because it prevents the package from being completely released from the mold 44, and results in unacceptably cracked or cratered packages. The adhesion increases as the bonding surface becomes more porous. However, it is known that adhesion decreases between the molding compound and the more dense crystal structures of the noble metals, e.g., gold, and the very dense, high-hardness chrome steels, as well as various chrome surface treatments for these tool steels. Thus, molds 44 for semiconductor packages 60 or 62 are frequently made of very dense, high-hardness chrome steels, and the interior surfaces of their chases are polished very smoothly and then chrome plated to reduce the amount of adhesion between the mold 44 and the plastic body 40 of the package.

Nevertheless, the addition of a "release agent" to the molding compound chemistry is required to further reduce the chemical bonding between the molding compound 54 and the surfaces of the molding apparatus that come into contact with the molding compound during molding, particularly the surfaces of the cavity 42. The cavity 42 is, of course, necessary to form and shape the package body 40, and also to enable complete densification of the body by the application of hydrostatic pressure to the molding compound 54 by the transfer ram or piston 56 during the molding process. The addition of this agent to the molding compound is therefore especially critical in epoxy chemistry due to the large number of reactive sites present in the mold chase during the molding process.

Mold release agents commonly used include heavy waxes, such as carnauba wax. This is a natural wax extracted from palm trees. Increasingly, this compound is being replaced by synthetic ester waxes and other high-molecular-weight, non-reactive organic compounds. In some cases, two release agents are used, one for release at a low temperature, and the other for release at a high temperature, viz., the molding temperature.

The release agent is activated thermally, and upon melting, coats the surface of all of the components in the molding matrix. This non-reactive coating inhibits interfacial bonding of the molding compound 54 and all other components within the package materials matrix, such as the leads 14 of a lead-frame 10, the substrate 30, the die 20, and the bonding wires 22. Reducing the total amount of mold release agent(s) in the molding compound would thus substantially improve the interfacial bonding within the package component matrix. However, for the reasons given above, when reducing the amount of release agent in the molding compound 54, particular care must be taken in the choice of mold tool steel and/or mold tool surface treatments to prevent chemical bonding to the mold 44, which would inhibit proper package ejection from the mold and result in defective packages.

The formation of good bonds between the reacting components of a molding compound 54 and the surface molecules of the components of the semiconductor package 60 or 62 is directly proportional to surface wetting. The package components in contact with the molding compound comprise the leadframe 10 or insulative substrate 30, including the leads 14 or conductive traces 32, the die 20, the connector wires 22, the die attach adhesive, and a filler, such as silica. Poor wetting of the surfaces of these elements of the package leads to the formation of interfacial defects that act as potential sites for future propagation of cracks and subsequent penetration of the package by moisture.

To improve the chemical bonding of the molding compound 54 to the package components, an "adhesion promoter," or "coupling agent," is added to the molding compound during its formulation. Due to the reduction in interfacial bonding caused by the addition of the mold release agents, it is necessary to add a higher percentage of the adhesion promoters than might otherwise thought to be desirable. This is because, in relatively larger amounts, these coupling agents can increase melt viscosity, which reduces the surface wetting of the molding compound 54 to the surface of the leadframe 10 or substrate 30 and other components in the package matrix. This increased melt viscosity is due to the premature cross-linking of the base resin and the hardener caused by the overabundance of the coupling agent during the mixing that occurs in the transfer, or injection, of the molding compound 54 into the mold cavity 42.

These coupling agents are generally a reactive silane, but various other organic compounds may used. These include glycidyl ethers, and chelates, such as benzotriazole, titanates or zircoaluminates. The coupling agent will have at least two reactive groups, one to react with the functional groups of the molding compound 54, and the other to react with the materials of the other package components. In many cases, there are additional reactive groups attached to the coupling agent to allow selective coupling to specific package components, such as the lead frame 10 or the filler. The surface may be, e.g., a silica filler, or the material of the leadframe 10, e.g., copper or aluminum. In the case of the leadframe material, the primary bonding mechanism is, in most applications, from the coupling agent to a thin oxide surface present thereon.

One epoxy resin molding compound that has proven to be both versatile and reliable is epoxidized ortho cresol novolac ("EOCN"), along with a cresol novolac hardner. There are, however, newer epoxy formulations of even higher functionality than the EOCN. Due to this higher functionality, the cross-link density of these compounds is higher. As the cross-link density increases, the more closely packed will be the final polymer. This results in compounds that are more impervious to moisture penetration, have higher glass transition temperatures and other enhanced properties. The newer epoxy compounds are Biphenyl, Dicyclopentadene, and so-called "Multifunctional" compounds. And, as in the case of EOCN, the reduction of mold release agents and adhesion promoters in these latter, enhanced epoxies is highly desirable.

Thus, in all cases, the reduction or elimination of the waxy mold release agents will present a more active surface for chemical bonding. However, this goal cannot be achieved unless the surfaces of the chase of the molding apparatus that come into contact with the molding compound 54 during the molding process, including the pot 50, piston 56, runner 52, gate 53, cavity 42, vent 55, and ejector pins 58, are made of or coated with a material that is substantially non-reactive with the highly reactive epoxy molding compound. Moreover, such a reduction or elimination of the release agent would permit a concomitant reduction or elimination of the coupling agent, or adhesion promoter, in the molding compound, which would better balance the formulation and prevent premature cross-linking of the molding compound during the mixing and transfer to the contacting surfaces of the molding apparatus.

In accordance with the present invention, the molding tool 44 is made of a very dense, high-hardness steel, e.g., a chrome steel, and all of the surfaces of the chase of the mold 44 that come into contact with the molding compound 54 during the molding process, including the pot 50, piston 56, runner 52, gate 53, cavity 42, vent 55, and ejector pins 58, are plated with a coating of "nodular thin dense chromium" ("NTDC"). This surface treatment renders these surfaces substantially non-reactive with the highly reactive epoxy molding compound 54, and the problems of mold sticking and cracked or cratered package bodies 40 is substantially reduced, or eliminated altogether.

Moreover, this reduction in the reactivity between the mold 44 and the molding compound 54 permits a corresponding reduction or elimination of both the release agents and coupling agents otherwise necessary in the molding compound, thereby providing substantially improved adhesion between the molding compound and the components of the package matrix and preventing premature cross-linking of the molding compound during its mixing and transfer to the contacting chase surfaces of the mold 44. This results in semiconductor package bodies 40 that are stronger, denser, and more highly resistant to delamination, cracking, and penetration by moisture.

The hard nodular chromium coating can be applied to the affected surfaces of the mold 44 by the commercially available Armoloy® process that is widely available from franchised Armoloy dealers located throughout the U.S. and Europe. A listing of Armoloy dealers can be obtained from the Armoloy Company of Philadelphia, 1105 Miller Avenue, Croydon, Pa. 19021.

The ARMOLOY process is a proprietary chromium electroplating process that produces a nodular thin dense chromium ("NTDC") coating having a hardness in excess of 70 $R_C$ (1,020–1100 Vickers Diamond hardness) and an extremely low coefficient of friction, e.g., a static coefficient of friction of 0.14. The finish is applied in an extremely thin (about 0.0001" to about 0.0002" thick) coating, and retains its desirable properties at elevated temperatures, viz., 1400° F. As plated, it has a gray, satin-matte finish of about 8 RMS.

FIG. 7 is a microscopic view of a surface plated with nodular thin dense chromium coating 70. The extremely small, nodular characteristic of this surface may be compared to the much larger nodular characteristics of a surface plated with a conventional hard chromium plating 72 shown in the microscopic view of FIG. 8.

FIG. 9 is a microscopic cross-sectional view showing the extreme thinness and very fine nodular nature of the NTDC coating 70, as compared to the relatively coarser nodular structure of an underlying high-hardness, chrome steel molding tool 44 upon which the NTDC coating has been plated.

While the proprietary plating is not recommended for use on aluminum, magnesium, or titanium, it is compatible with all ferrous metals, and in particular, the type of dense, high-hardness chrome steels used to make the semiconductor package molding tool 44. Surfaces plated with the finish exhibit extremely low adhesion with epoxy resin. As a consequence, by plating the surfaces of the chase of the molding tool 44 that come in to contact with the molding compound during molding, viz., the pot 50, piston 56, runner 52, gate 53, cavity 42, vent 55, and ejector pins 58, with the finish, the mold 44 will exhibit a superior non-reactivity with the molding compound 54 of the package body 40, and hence, exceptionally good package release. This, in turn, permits the amount of both release agents and adhesion promoters used in the molding compound 54 to be substantially reduced, or eliminated altogether, thereby resulting in a semiconductor package body 40 having improved strength and adhesion with the components of the package, and hence, an improved resistance to the propagation of cracks and subsequent penetration of the package by moisture.

As an alternative to the proprietary Armoloy process, it is believed that comparable NTDC electroplated coatings can be applied from a solution containing chromic acid ($CrO_3$) and a catalytic anion, as described in, for example, "Hard Chromium Plating," Hyman Chessin and Everett H. Fernald, Jr., *Metals Handbook, Ninth Ed.*, Vol. 5, "Surface Cleaning, Finishing, and Coating," (1982) pp. 170–187. As described by the authors therein, NTDC coatings of exceptionally high hardness may be obtained by using high current densities in plating baths employing a mixed catalyst. Other processes that are believed to provide NTDC platings are described in U.S. Pat. Nos. 4,092,226 to N. Laing et al., and 4,717,456 to H. Chessin et al.

Indeed, those of skill in the art will recognize that many modifications and variations are possible to the method of the present invention, depending on the particular problem at hand. Accordingly, the particular embodiments described and illustrated herein should be understood as being exemplary in nature, and not as limitations on the scope of the present invention, which is defined instead by that of the claims appended hereinafter.

What is claimed is:

1. A method of molding a plastic body of a semiconductor package, comprising:

provinding a mold within which a semiconductor device is to be inserted for molding a plastic body thereon, said mold having a coating of nodular thin dense chromium ("NTDC") on a surface thereof;

inserting the semiconductor device into said mold; and, molding a plastic material over all or a part of said semiconductor device to form said plastic body, wherein said plastic material contacts said coating during said molding.

2. The method of claim 1, wherein said coating has a coefficient of static friction of 0.14 or less.

3. The method of claim 1, wherein said coating has a hardness of 70 or greater on the Rockwell "C" hardness scale.

4. The method of claim 1, wherein said coating is from about 0.0001" to about 0.0002" in thickness.

5. The method of claim 1, wherein said coating has a finish of about 8 RMS.

6. The method of claim 1, wherein said coating is formed by an Armoloy® process.

7. The method of claim 1, wherein said plastic material does not include a mold release agent.

8. The method of claim 1, wherein said plastic material does not include an adhesion promoter.

9. The method of claim 1, wherein said semiconductor device is mounted on a leadframe, and further comprising molding said plastic material over a portion of said leadframe.

10. The method of claim 1, wherein said semiconductor device is mounted on a substrate, and further comprising molding said plastic material over a portion of said substrate.

11. The method of claim 1, wherein said mold includes a chase, and wherein said chase has a coating of said NTDC on a surface thereof.

12. The method of claim 11, wherein said chase of said mold includes a pot, a piston, a runner, a gate, a cavity, and an ejector pin, and wherein said pot, piston, runner, gate, cavity, and ejector pin have a coating of nodular thin dense chromium ("NTDC") on a surface thereof.

13. A method of making a mold for molding a plastic body of a semiconductor device package, the method comprising:

forming a coating of NTDC on a surface of the mold that is to be contacted by a plastic molding material used to form said body.

* * * * *

UNITED STATES PATENT AND TRADEMARK OFFICE
CERTIFICATE OF CORRECTION

PATENT NO.    : 6,309,916 B1                                               Page 1 of 1
DATED         : October 30, 2001
INVENTOR(S)   : Sean T. Crowley, Gerald L. Cheney and David S. Razu It is certified that error appears in the above-identified patent and that said Letters Patent is hereby corrected as shown below:

Column 3,
Line 20, delete "semiconduiter" and replace with -- semiconductor --.

Signed and Sealed this

Twenty-eighth Day of January, 2003

JAMES E. ROGAN
*Director of the United States Patent and Trademark Office*